(12) United States Patent
Kim

(10) Patent No.: US 8,084,325 B2
(45) Date of Patent: Dec. 27, 2011

(54) SEMICONDUCTOR DEVICE AND METHOD FOR FABRICATING THE SAME

(75) Inventor: Myung-Ok Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 701 days.

(21) Appl. No.: 12/165,129

(22) Filed: Jun. 30, 2008

(65) Prior Publication Data

US 2009/0045465 A1 Feb. 19, 2009

(30) Foreign Application Priority Data

Aug. 13, 2007 (KR) .................. 10-2007-0081201

(51) Int. Cl.
*H01L 21/336* (2006.01)
(52) U.S. Cl. .................... 438/259; 438/270
(58) Field of Classification Search .............. 438/259, 438/270; 257/366
See application file for complete search history.

(56) References Cited

U.S. PATENT DOCUMENTS

| | | | | |
|---|---|---|---|---|
| 6,087,222 | A * | 7/2000 | Jung Lin et al. | 438/259 |
| 6,093,606 | A * | 7/2000 | Lin et al. | 438/259 |
| 6,794,710 | B2 * | 9/2004 | Chang et al. | 257/315 |
| 7,071,059 | B1 * | 7/2006 | Kim | 438/259 |
| 7,189,617 | B2 * | 3/2007 | Slesazeck et al. | 438/259 |
| 7,354,827 | B2 * | 4/2008 | Seo et al. | 438/270 |
| 7,371,645 | B2 * | 5/2008 | Muemmler et al. | 438/270 |
| 7,393,749 | B2 * | 7/2008 | Yilmaz et al. | 438/259 |
| 7,462,908 | B2 * | 12/2008 | Bol et al. | 257/328 |
| 7,476,589 | B2 * | 1/2009 | Grebs et al. | 438/270 |
| 7,741,178 | B2 * | 6/2010 | Yi | 438/259 |
| 7,763,513 | B2 * | 7/2010 | Wang et al. | 438/259 |
| 7,767,524 | B2 * | 8/2010 | Yilmaz et al. | 438/259 |
| 7,790,550 | B2 * | 9/2010 | Hirler et al. | 438/270 |
| 7,807,536 | B2 * | 10/2010 | Sreekantham et al. | 438/270 |
| 7,816,216 | B2 * | 10/2010 | Ananthan | 438/294 |
| 2002/0024093 | A1 * | 2/2002 | Ahn et al. | 257/332 |
| 2002/0151136 | A1 * | 10/2002 | Lin et al. | 438/259 |
| 2005/0127420 | A1 * | 6/2005 | Kito et al. | 257/296 |
| 2005/0151190 | A1 * | 7/2005 | Kotek et al. | 257/341 |
| 2005/0167742 | A1 * | 8/2005 | Challa et al. | 257/328 |
| 2006/0267088 | A1 * | 11/2006 | Sharp et al. | 257/341 |
| 2007/0190728 | A1 * | 8/2007 | Sreekantham et al. | 438/270 |
| 2008/0211018 | A1 * | 9/2008 | Moriwaki | 257/333 |
| 2009/0181529 | A1 * | 7/2009 | Kang et al. | 438/586 |
| 2010/0327346 | A1 * | 12/2010 | Jeong et al. | 257/332 |

FOREIGN PATENT DOCUMENTS

| | | | |
|---|---|---|---|
| KR | 100596804 B1 | 6/2006 | |
| KR | 100713942 B1 | 4/2007 | |

* cited by examiner

*Primary Examiner* — N Drew Richards
*Assistant Examiner* — Grant Withers
(74) *Attorney, Agent, or Firm* — Kilpatrick Townsend & Stockton LLP

(57) ABSTRACT

A semiconductor device can prevent exposure of an inner wall of a recess pattern caused by misalignment between masks. A gate electrode is formed inside the recess pattern so that only a gate hard mask layer is exposed above a substrate surface. Since the gate electrode is not exposed above the substrate, it is possible to prevent SAC failure and decrease an aspect ratio of a gate pattern to increase an open margin of a contact hole. Thus, a semiconductor device having a recess channel gate structure which exhibits a superior refresh property is fabricated.

17 Claims, 6 Drawing Sheets

ETCH-BACK

ETCH-BACK

SEMICONDUCTOR DEVICE AND METHOD FOR FABRICATING THE SAME

CROSS-REFERENCE TO RELATED APPLICATIONS

This application claims priority of Korean patent application number 2007-0081201, filed on Aug. 13, 2007, which is incorporated by reference in its entirety.

BACKGROUND OF THE INVENTION

The present invention relates to semiconductor fabrication and, more particularly, to a method for forming a contact hole by self aligned contact etching and a method for forming a plug inside the contact hole.

A recess channel gate improves a refresh property of a semiconductor device. The recess channel gate is formed as follows: forming a recess pattern on a substrate; forming a gate dielectric layer, a gate conductive layer and a second gate conductive layer over the recess pattern and the substrate; and then patterning the resulting structure using a gate patterning mask.

FIG. 1 illustrates micrographic views of an inner wall surface of a recess pattern that is exposed during the formation of a recess channel gate.

Referring to FIG. 1, during the patterning, misalignment between a mask for forming the recess pattern and the gate patterning mask often causes an inner wall surface 11 of the recess pattern to be exposed. This may cause cell threshold voltage mismatch of the recess channel gate and generate etch residue, thereby producing defects. In addition, the exposure of the inner wall surface of the recess pattern may cause a bridge phenomenon between the recess channel gate and a landing plug after subsequent processes.

To overcome these limitations, a method has been proposed for reducing a line width of the recess pattern and increasing the line width of the recess channel gate to increase an overlay margin.

However, if the line width of the recess channel gate is increased to increase the overlay margin, the aspect ratio of the recess channel gate is also increased. Thus, the open margin of the landing plug contact hole is decreased.

FIG. 2 illustrates micrographic views of a landing plug contact hole subject to a not-open phenomenon that is generated during a self aligned contact etching.

Referring to FIG. 2, the landing plug contact hole may not open as shown by reference numeral 12.

In addition, if an over etch is performed or the thickness of a barrier layer protecting the recess channel gate is decreased to increase the open margin of the landing plug contact hole, a bridge phenomenon may occur between the recess channel gate and the landing plug. Hereinafter, the phenomenon that causes the landing plug contact hole to not open is referred to as a 'not-open defect', and the bridge phenomenon that occurs between the recess channel gate and the landing plug is referred to as a 'self aligned contact (SAC) failure.'

If the thickness of the barrier layer protecting the recess channel gate is increased to overcome the SAC failure, the not-open defect may be generated.

SUMMARY OF THE INVENTION

Embodiments of the present invention are directed to providing a semiconductor device that can prevent exposure of an inner wall of a recess pattern caused by misalignment between masks, as well as SAC failure and a not-open defect, and a method for fabricating the semiconductor device.

In accordance with an aspect of the present invention, a method for fabricating a semiconductor device is provided. The method includes etching a substrate to form a recess pattern, forming a gate dielectric layer over the recess pattern, forming a gate electrode over the gate dielectric layer inside of the recess pattern, forming a gate hard mask pattern over the gate electrode layer and upper corners of the recess pattern, and forming a plug over the substrate between the gate hard mask pattern and an adjacent gate hard mask pattern.

In accordance with another aspect of the present invention, a semiconductor device is provided. The device includes a recess pattern formed in a substrate, a gate dielectric layer formed on the recess pattern, a gate electrode formed on the gate dielectric layer inside the recess pattern, a gate hard mask pattern formed over the gate electrode and upper corners of the recess pattern, and a plug formed on the substrate between the gate hard mask pattern and an adjacent gate hard mask pattern.

DESCRIPTION OF SPECIFIC EMBODIMENTS

In order to overcome the above described limitations in a process for forming a landing plug contact hole, the embodiments of the present invention are directed to filling a gate electrode inside a recess pattern so that only a gate hard mask layer is exposed above a substrate. Thus, a semiconductor device having a recess channel gate structure which exhibits a superior refresh property is fabricated. Since the gate electrode is not exposed above the substrate, it is possible to prevent SAC failure and decrease an aspect ratio of a gate pattern to increase an open margin of a contact hole.

FIGS. 3A to 3H illustrate a method for fabricating a semiconductor device in accordance with an embodiment of the present invention.

Figure 1:
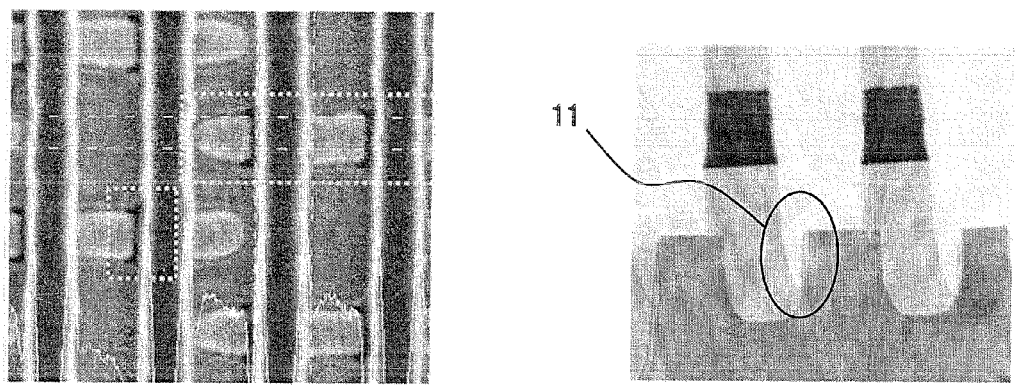
FIG. 1 illustrates micrographic views of an inner wall surface of a recess pattern that is exposed during the formation of a recess channel gate.
Figure 2:
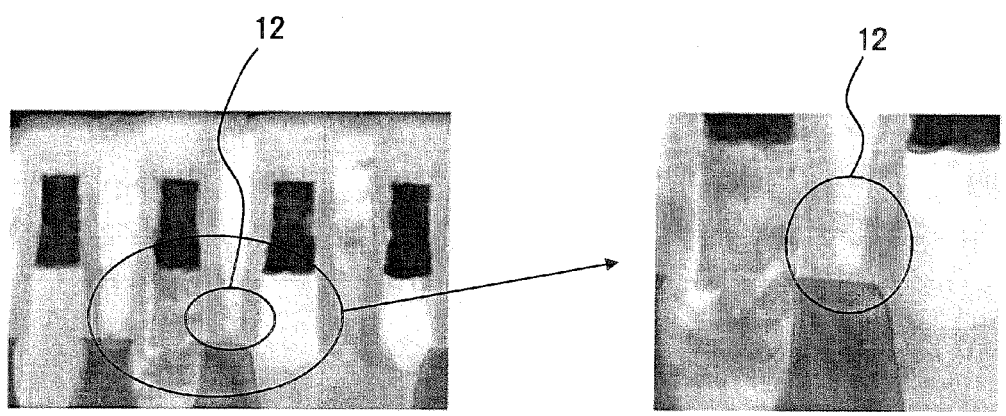
FIG. 2 illustrates micrographic views of a landing plug contact hole subject to a not-open phenomenon that is generated during a self aligned contact etching.
Figure 3A:
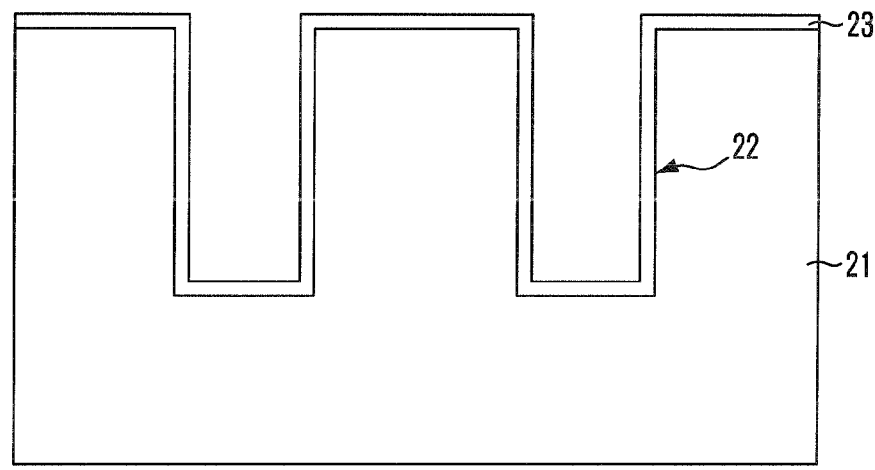
FIGS. 3A to 3H illustrate a method for fabricating a semiconductor device in accordance with an embodiment of the present invention.

Referring to FIG. 3A, a substrate 21 is etched to form a plurality of recess patterns 22. The recess patterns 22 may be formed in the shape of lines.

A gate dielectric layer 23 is formed over the substrate 21 including a surface of the recess patterns 22.

The gate dielectric layer 23 may be formed through a gate oxidation process.

Figure 3B:
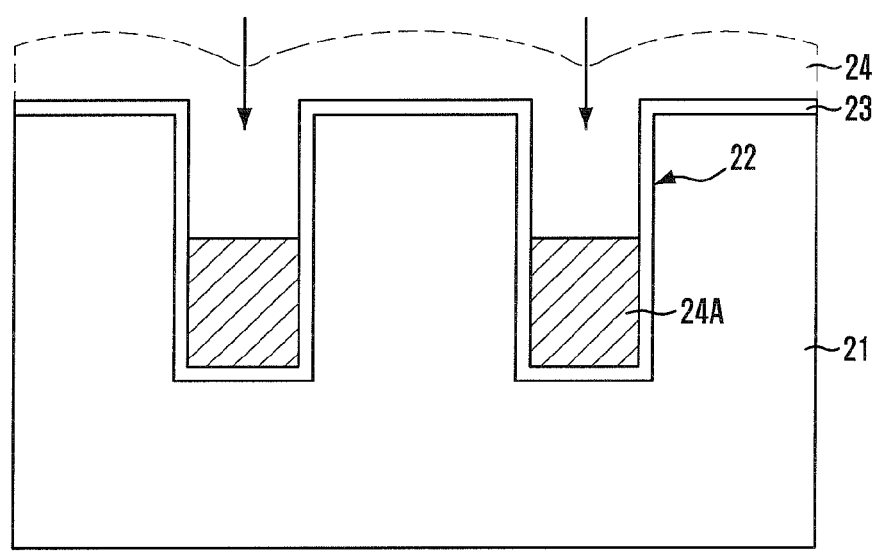

Referring to FIG. 3B, a first gate conductive pattern 24A is formed over the gate dielectric layer 23 in the recess patterns 22 to fill a predetermined depth of each recess pattern 22. The first gate conductive pattern 24A may be formed of polysilicon.

The first gate conductive pattern 24A may be formed as follows. A first gate conductive layer 24 is formed over the gate dielectric layer 23 to fill the recess patterns 22. A dry etch-back is performed on the first gate conductive layer 24 to fill only the predetermined depth of each recess pattern 22. The dry etch-back may include a first etch-back and a second etch-back.

The first etch-back may be performed to completely remove the first gate conductive layer 24 outside of the recess patterns 22. The first etch-back may be performed at a process pressure of approximately 30 mTorr to approximately 100 mTorr, a maximum power of approximately 100 W to approximately 1,000 W, and a minimum power of approximately 50 W to approximately 800 W. A first etch gas may include a main gas such as hydrogen bromide (HBr) gas, chlorine ($Cl_2$) gas or a mixture gas thereof, and an additive gas such as oxygen ($O_2$) gas, argon (Ar) gas, helium (He) gas or a combination thereof. For example, a mixture gas of hydrogen bromide (HBr) gas, oxygen ($O_2$) gas and argon (Ar) gas may be used as the etch first gas.

The second etch-back may be performed under conditions identical to that of the first etch-back, except that the etch selectivity of the gate dielectric layer 23 is higher than that of the first etch-back. As such, only the first gate conductive layer 24 is selectively etched so that the first gate conductive pattern 24A fills only a predetermined depth of each recess pattern 22. A second etch gas may include a main gas of HBr gas, and an additive gas including $O_2$ gas, Ar gas or He gas. For example, a mixture gas of HBr gas, $O_2$ gas and Ar gas may be used as the second etch gas.

Figure 3C:
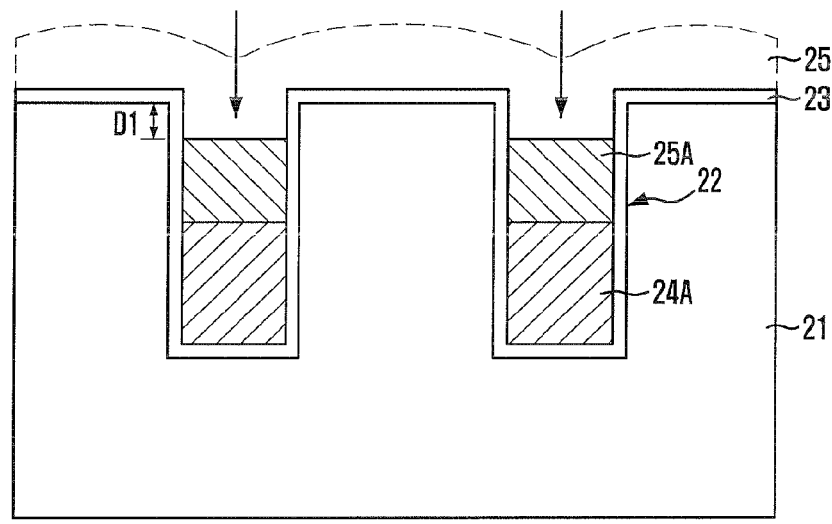

Referring to FIG. 3C, a second gate conductive pattern 25A is formed over the first gate conductive pattern 24A in each recess pattern 22. Preferably, a depth D1 measured from a top surface of the second gate conductive pattern 25A to a surface of the substrate 21 ranges from approximately 100 Å to approximately 200 Å. The second gate conductive pattern 25A may be formed of at least one of a tungsten (W) layer, a tungsten silicide ($WSi_x$, where x is a natural number) layer, a tantalum nitride (TaN) layer, a titanium (Ti) layer, a tungsten nitride (WN) layer or a titanium nitride layer (TiN). For example, the second gate conductive pattern 25A may be multiple layers of a titanium nitride layer and a tungsten nitride layer.

In order to form the second gate conductive pattern 25A in each recess pattern 22 as described above, a wet etch-back is performed using a chemical having a higher wet etch rate for the second gate conductive layer 25 relative to the gate dielectric layer 23.

The wet etch-back has an isotropic etching characteristic to remove the second gate conductive layer 25 over the substrate 21 outside the recess pattern 22 and has an etch selectivity such that the gate dielectric layer 23 is not removed from the substrate 21. A sulfuric acid-peroxide mixture (SPM) or an ammonium hydroxide-peroxide mixture (APM) may be used as an etching chemical for the wet etch-back.

Figure 3D:
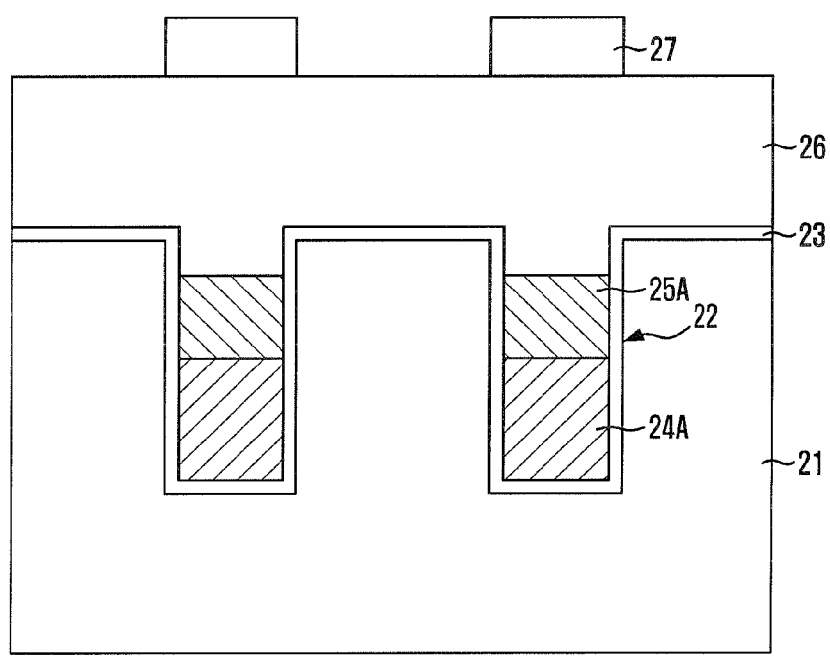

Referring to FIG. 3D, a gate hard mask layer 26 is formed over the substrate 21 including the gate dielectric layer 23 and the second gate conductive pattern 25A.

The gate hard mask layer 26 may include at least one of a nitride layer, an amorphous carbon layer, a silicon oxynitride (SiON) layer, a W layer or a tungsten silicide ($WSi_x$, where x is a natural number) layer. For example, the gate hard mask layer 26 may be multiple layers of a silicon nitride layer and a tungsten layer.

A photoresist layer is formed over the gate hard mask layer 26, and then a photoresist pattern 27 is formed using a gate patterning mask. If the photoresist pattern 27 is not sufficient to etch the gate hard mask layer 26, a hard mask layer may be formed between the photoresist pattern 27 and the gate hard mask layer 26.

Figure 3E:
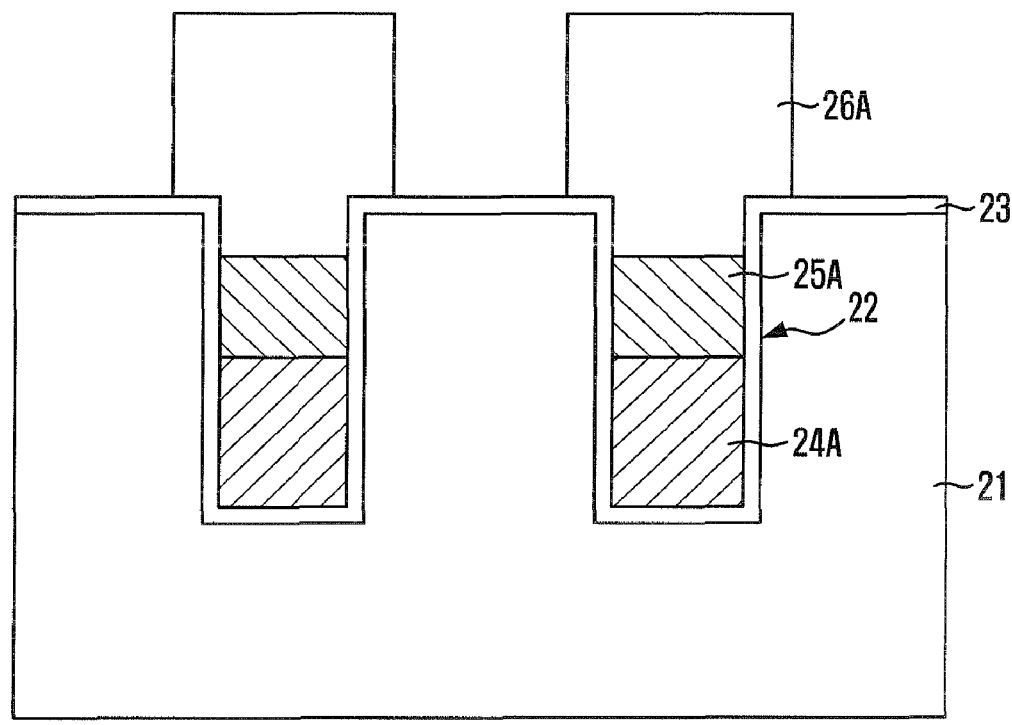

Referring to FIG. 3E, the gate hard mask layer 26 is etched using the photoresist pattern 27 as an etch barrier to form a gate pattern including multiple layers of the gate dielectric layer 23, the first gate conductive pattern 24A, the second gate conductive pattern 25A and the gate hard mask pattern 26A.

In order to address the misalignment between the gate patterning mask and the mask for forming the recess pattern 22, it is preferable to form the gate pattern with a line width that is greater than the gate electrode. As a result, the gate hard mask pattern 26A is formed over upper corners of the recess pattern 22 as well as the gate electrode. The gate hard mask pattern 26A is also formed over a portion of the substrate 21 outside the recess pattern 22. As a result, the gate hard mask pattern 26A is formed over the recess pattern 22 fully and completely.

Figure 3F:
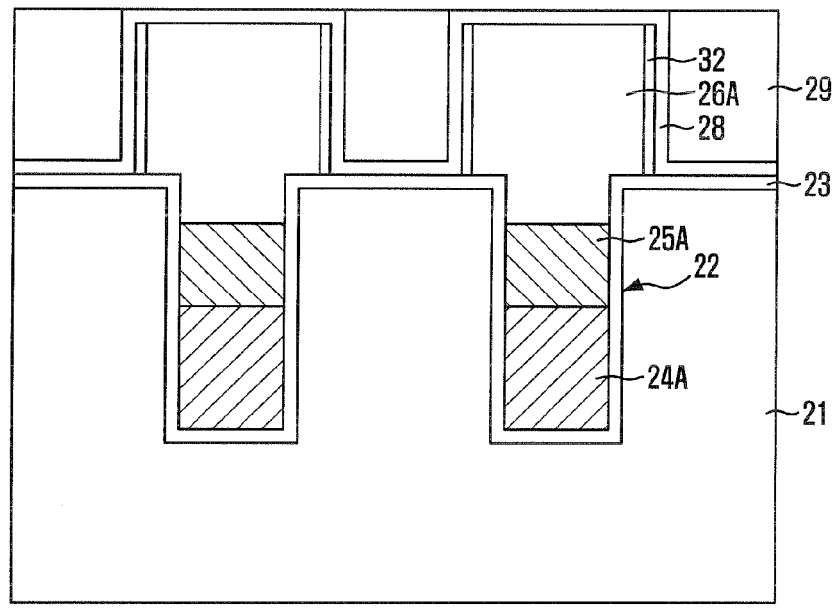

Referring to FIG. 3F, a gate spacer 32 is formed on lateral sides of the gate hard mask pattern 26A. A barrier layer 28 is formed over the gate hard mask pattern 26A, the gate spacers 32 and the gate dielectric layer 23, and then an interlayer dielectric layer 29 is formed over the barrier layer 28.

The gate spacer 32 may be formed of a nitride based material, such as silicon nitride ($Si_3N_4$). The gate spacer 32 may be omitted if the gate electrode can be protected sufficiently by only the gate hard mask pattern 26A.

The barrier layer 28 and the interlayer dielectric layer 29 have a high etch selectivity relative to each other. For example, if the barrier layer 28 is a $Si_3N_4$ layer, the interlayer dielectric layer 29 may be an oxide-based layer such as a boron phosphorous silicate glass layer (BPSG).

In the case where the interlayer dielectric layer 29 is formed of BPSG, it is preferable to perform annealing to densify the layer and chemical mechanical polishing to planarize the layer.

The barrier layer 28 preferably has a minimum thickness in consideration of a distance between adjacent gate hard mask patterns 26A. The barrier layer 28 may also be omitted because the gate electrode including the first gate conductive pattern 24A and the second gate conductive pattern 25A is formed inside the recess pattern 22 without being exposed above a surface of the substrate 21.

Figure 3G:
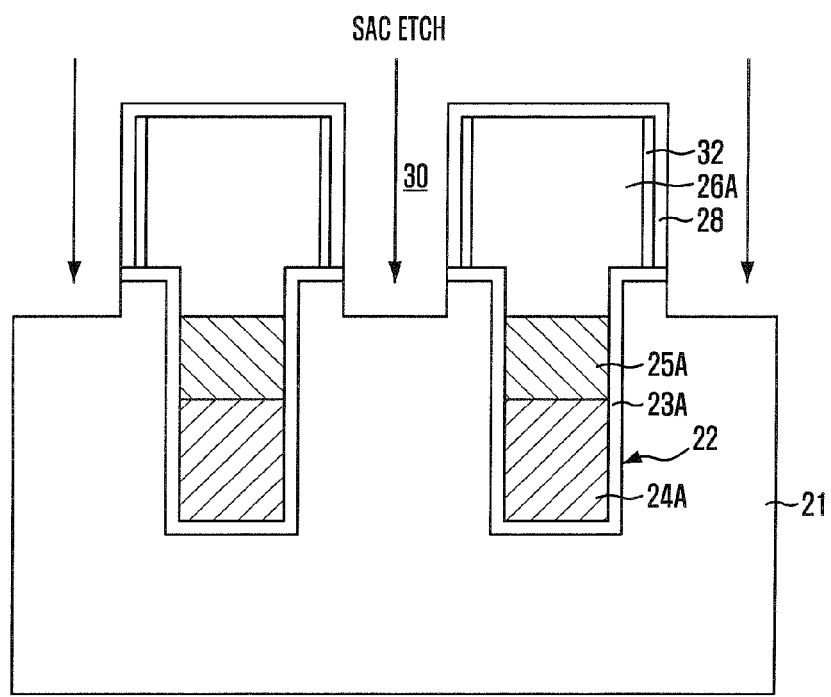

Referring to FIG. 3G, a self align contact (SAC) etching is performed.

The SAC etching utilizes the high etch selectivity between the interlayer dielectric layer 29 and the barrier layer 28 to etch the interlayer dielectric layer 29 between adjacent gate hard mask patterns 26A, thereby forming a contact hole 30. In the case where the barrier layer 28 is omitted, the SAC etching may utilize the high etch selectivity between the interlayer dielectric layer 29 and the gate hard mask pattern 26A.

In addition, through the SAC etching, the substrate 21 may also be recessed to a predetermined depth within the contact hole 30 to increase a contact area of a plug formed in a subsequent process.

Figure 3H:
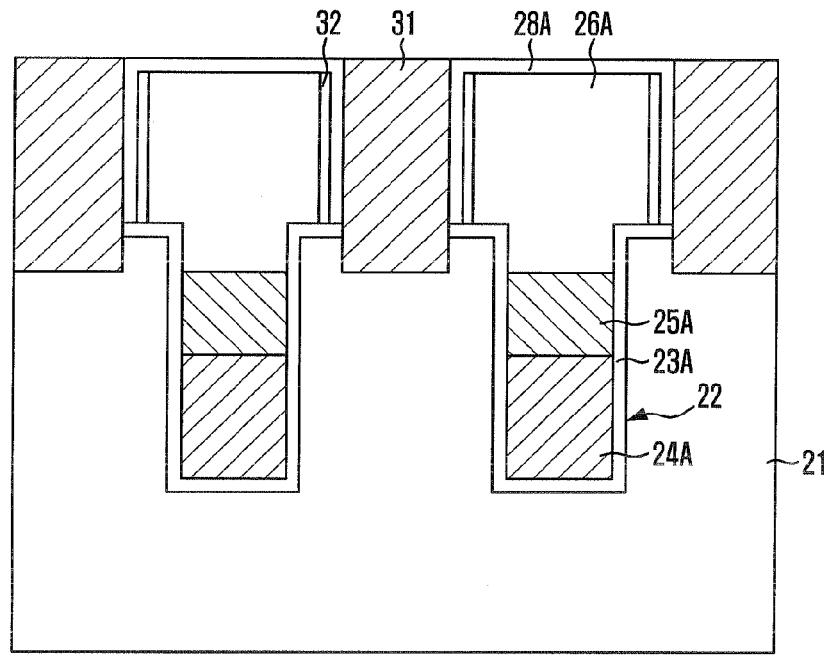

Referring to FIG. 3H, a plug is formed to fill the contact hole 30.

The plug 31 is referred to as a landing plug, and may be formed of polysilicon.

In order to form the plug 31, a polysilicon layer is formed to fill the contact hole 30, and then an etch-back or chemical mechanical polishing is performed on the polysilicon layer.

As such, the plug can be formed without generating the SAC failure and the not-open defect.

As described above, the gate electrode including the first gate conductive pattern 24A and the second gate conductive pattern 25A is formed inside the recess pattern 22. The gate hard mask pattern 26A is formed over the gate electrode and upper corners of the recess pattern 22. Through the SAC etching, the gate hard mask pattern 26A extends vertically beyond a surface of the substrate 21 in a bar shape so that the plug 31 is formed between adjacent gate hard mask patterns 26A.

Since the gate electrode is not exposed above the substrate 21 during the SAC etching, it is possible to prevent the SAC failure. This allows the etching process to be performed so that the surface of the substrate 21 is exposed. Thus, it is also possible to prevent the not-open defect. In this case, the gate hard mask pattern 26A may have a round shape. This may reduce the aspect ratio of the contact hole 30, thereby facilitating formation of the plug 31.

Further, contrary to the typical SAC etching requiring an undoped silicate glass (USG) layer on the gate pattern to protect the gate pattern, it is possible to omit the USG layer. This is because the gate electrode is formed inside the recess pattern 22 so that it is not exposed above a surface of the substrate 21. For the same reason, it is also possible to omit gate light oxidation for protecting the gate conductive patterns 24A, 25A.

Furthermore, because the gate electrode is formed inside the recess pattern, it is possible to prevent the SAC failure due to the misalignment between the gate patterning mask and the mask for forming the recess pattern.

Such a gate for covering the gate electrode formed inside the recess pattern to optimize alignment is referred to as a self matched gate (SMG).

Figure 4:
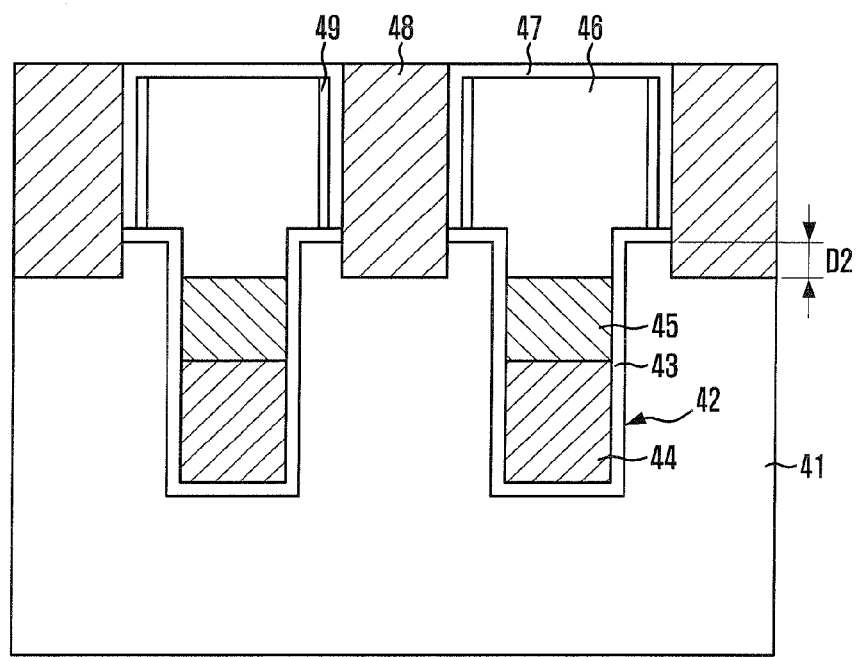
FIG. 4 illustrates a cross-sectional view of the semiconductor device in accordance with an embodiment of the present invention.

FIG. 4 illustrates a cross-sectional view of the semiconductor device in accordance with an embodiment of the present invention.

Referring to FIG. 4, the semiconductor device includes a recess pattern 42, a gate dielectric layer 43, a gate electrode including a first conductive pattern 44 and a second conductive pattern 45, a gate hard mask pattern 46, and a plug 48. The recess pattern 42 is formed in the substrate 41. The gate dielectric layer 43 is formed on the recess pattern 42. The gate electrode is formed on the gate dielectric layer 43 inside the recess pattern 42. The gate hard mask pattern 46 is formed over the gate electrode and upper corners of the recess pattern 42. The plug 48 is formed between adjacent gate hard mask patterns 46. The semiconductor device further includes a gate spacer 49 and a barrier layer 47. The gate spacer 49 is formed on lateral sides of the gate hard mask pattern 46. The barrier layer 47 is formed on the gate spacers 49 and an upper surface of the gate hard mask pattern 46.

The gate electrode has a multi-layered structure including the first conductive pattern 44 and the second conductive pattern 45. The first and second conductive patterns 44, 45 are formed inside the recess pattern 42. Preferably, a depth D2 from a top surface of the second gate conductive pattern 45 to a surface of the substrate 41 ranges from approximately 100 Å to approximately 200 Å. The first gate conductive pattern 44 may include a polysilicon layer. The second gate conductive pattern 45 may include at least one of a W layer, a $WSi_x$ layer, where x is a natural number, a TaN layer, a Ti layer, a WN layer or a TiN layer. For example, the second gate conductive pattern 45 may have a multi-layered structure of the TiN layer and the WN layer.

In order to address the misalignment between the gate patterning mask and the mask for forming the recess pattern 42, it is preferable to form the gate pattern to have a line width that is greater than the gate electrode. As a result, the gate hard mask pattern 46 is formed upper corners of the recess pattern 42 as well as the gate electrode. The gate hard mask pattern 46 is also formed over a portion of the substrate 41 outside the recess pattern 42. As a result, the gate hard mask pattern 46 is formed over the recess pattern 42 fully and completely. The gate hard mask pattern 46 may include at least one of a nitride layer, an amorphous carbon layer, a SiON layer, a W layer or a $WSi_x$ layer, where x is a natural number. For example, the gate hard mask pattern 46 may have a multi-layered structure of the silicon nitride layer and the W layer.

The gate dielectric layer 43 includes an oxide layer, and the gate spacer 49 includes a silicon nitride layer. The gate spacer 49 may be omitted if the gate electrode can be protected sufficiently by the gate hard mask pattern 46.

The barrier layer 47 includes a SiON layer, and the plug 48 includes a polysilicon layer.

The gate electrode including the first and second gate conductive patterns 44, 45 is formed inside the recess pattern 42. The gate hard mask pattern 46 is formed over the gate electrode and the upper corners of the recess pattern 42. The gate hard mask pattern 46 extends vertically beyond an upper surface of the substrate 41 in a bar shape so that the plug 48 is formed between adjacent gate hard masks of the gate hard mask pattern 46.

Since the gate electrode is not exposed above the substrate 41 during the SAC etching, it is possible to prevent the SAC failure. Hence, it is possible to perform the etching so that the surface of the substrate 41 is exposed. This allows the not-open defect to be prevented.

In addition, because the gate electrode is formed inside the recess pattern 42, it is also possible to prevent the SAC failure due to misalignment between the gate patterning mask and the mask for forming the recess pattern.

As described above, in accordance with the present invention, it is possible to prevent the exposure of the inner wall surface of the recess pattern due to the misalignment between the masks, the SAC failure, and the not-open defect. This can improve the stability and the reliability of the semiconductor device.

In addition, the recess channel gate structure can improve the refresh property of the semiconductor device.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a recess pattern in a substrate;
   forming a gate dielectric layer over the recess pattern;
   forming a gate electrode over the gate dielectric layer inside the recess pattern, wherein the gate electrode does not extend above a surface of the substrate;
   forming a gate hard mask pattern over the gate electrode and upper corners of the recess pattern;
   forming a barrier layer over the gate hard mask pattern;
   forming an interlayer dielectric layer over the barrier layer;
   forming a contact hole by performing a self aligned contact (SAC) etching by using an etch selectivity between the interlayer dielectric layer and the barrier layer, wherein the substrate between the gate hard mask pattern and an adjacent gate hard mask pattern is recessed to a predetermined depth; and
   forming a plug over the substrate between the gate hard mask pattern and the adjacent gate hard mask pattern by filling the contact hole.

2. The method of claim 1, wherein the gate hard mask pattern is formed over a portion of the substrate outside the recess pattern.

3. The method of claim 1, further comprising forming a gate spacer on lateral sides of the gate hard mask pattern.

4. The method of claim 1, wherein the gate electrode comprises a first gate conductive pattern and a second gate conductive pattern.

5. The method of claim 4, wherein forming the gate electrode comprises:
   forming a first gate conductive layer to fill the recess pattern;
   first etching the first gate conductive layer to form the first gate conductive pattern, wherein the first gate conductive layer is formed to a predetermined height inside the recess pattern;
   forming a second gate conductive layer over the first gate conductive pattern to fill the recess pattern; and
   second etching the second gate conductive layer to form the second gate conductive pattern inside the recess pattern.

6. The method of claim 4, wherein the first gate conductive pattern comprises a polysilicon layer, and the second gate conductive pattern comprises at least one layer selected from the group consisting of a tungsten (W) layer, a tungsten silicide ($WSi_x$, where x is a natural number) layer, a tantalum nitride (TaN) layer, a titanium (Ti) layer, a tungsten nitride (WN) layer and a titanium nitride (TiN) layer.

7. The method of claim 5, wherein first etching comprises a dry etching.

8. The method of claim 5, wherein first etching comprises:
   performing a first etch-back to remove the first gate conductive layer over the substrate outside the recess pattern; and
   performing a second etch-back on the first gate conductive layer to form the first gate conductive pattern at the predetermined height inside the recess pattern.

9. The method of claim 8, wherein the first etch-back is performed at a process pressure of approximately 30 mTorr to approximately 100 mTorr, a maximum power of approximately 100 W to approximately 1,000 W, and a minimum power of approximately 50 W to approximately 800 W.

10. The method of claim 8, wherein the first etch-back is performed using an etching gas comprising a main gas selected from the group consisting of hydrogen bromide (HBr) gas, chlorine ($Cl_2$) gas and a combination thereof, and an additive gas selected from the group consisting of oxygen ($O_2$) gas, argon (Ar) gas, helium (He) gas and a combination thereof.

11. The method of claim 8, wherein the second etch-back is performed at a process pressure of approximately 30 mTorr to approximately 100 mTorr, a maximum power of approximately 100 W to approximately 1,000 W, and a minimum power of approximately 50 W to approximately 800 W.

12. The method of claim 8, wherein the second etch-back is performed using an etching gas comprising HBr gas, and an additive gas selected from the group consisting of $O_2$ gas, Ar gas, He gas and a combination thereof.

13. The method of claim 5, wherein second etching comprises wet etching.

14. The method of claim 13, wherein the wet etching is performed using a wet chemical comprising a sulfuric acid-peroxide mixture (SPM) or an ammonium hydroxide-peroxide mixture (APM).

15. The method of claim 1, wherein the gate hard mask pattern comprises at least one layer selected from the group consisting of a nitride layer, an amorphous carbon layer, a silicon oxynitride (SiON) layer, a tungsten (W) layer and a tungsten silicide ($WSi_x$, where x is a natural number) layer.

16. The method of claim 1, wherein the plug comprises a polysilicon layer.

17. The method of claim 1, wherein forming the gate hard mask pattern includes:
   forming a gate hard mask layer over the substrate including the gate dielectric layer;
   forming a photoresist pattern over the gate hard mask layer; and
   etching the gate hard mask layer by using the photoresist pattern as an etch barrier.

* * * * *